(12) United States Patent
Jin et al.

(10) Patent No.: US 9,013,017 B2
(45) Date of Patent: Apr. 21, 2015

(54) METHOD FOR MAKING IMAGE SENSORS USING WAFER-LEVEL PROCESSING AND ASSOCIATED DEVICES

(71) Applicant: STMicroelectronics Asia Pacific Pte Ltd (Singapore), Singapore (SG)

(72) Inventors: Yonggang Jin, Singapore (SG); Laurent Herard, Singapore (SG); WeeChinJudy Lim, Singapore (SG)

(73) Assignee: STMicroelectronics Pte Ltd, Singapore (SG)

( * ) Notice: Subject to any disclaimer, the term of this patent is extended or adjusted under 35 U.S.C. 154(b) by 274 days.

(21) Appl. No.: 13/651,526

(22) Filed: Oct. 15, 2012

(65) Prior Publication Data

US 2014/0103476 A1 Apr. 17, 2014

(51) Int. Cl.
*H01L 31/0232* (2014.01)
*H01L 31/0203* (2014.01)

(52) U.S. Cl.
CPC ........ *H01L 31/0203* (2013.01); *H01L 31/0232* (2013.01)

(58) Field of Classification Search
USPC .............. 257/432, E31.127, E21.499; 438/65
See application file for complete search history.

(56) References Cited

U.S. PATENT DOCUMENTS

| | | | |
|---|---|---|---|
| 6,737,879 B2 | 5/2004 | Johnson | |
| 6,845,554 B2 | 1/2005 | Frankowsky et al. | |
| 7,276,783 B2 | 10/2007 | Goller et al. | |
| 7,517,722 B2 | 4/2009 | Goller et al. | |
| 7,759,167 B2 | 7/2010 | Vanfleteren et al. | |
| 7,911,068 B2 | 3/2011 | Meyer et al. | |
| 8,119,454 B2 | 2/2012 | Jin | |
| 8,153,458 B2 | 4/2012 | Weng et al. | |
| 8,227,927 B2 | 7/2012 | Chen et al. | |
| 8,236,608 B2 | 8/2012 | Yang | |
| 2005/0124093 A1 | 6/2005 | Yang et al. | |
| 2008/0170296 A1 | 7/2008 | Chaves et al. | |
| 2008/0173792 A1 | 7/2008 | Yang et al. | |
| 2008/0211075 A1 | 9/2008 | Yang et al. | |
| 2008/0224248 A1 | 9/2008 | Yang et al. | |
| 2008/0274579 A1 | 11/2008 | Yang et al. | |
| 2008/0290438 A1 | 11/2008 | Weng et al. | |
| 2009/0057544 A1 | 3/2009 | Brodie et al. | |
| 2009/0181490 A1 | 7/2009 | Weng et al. | |
| 2011/0068485 A1 | 3/2011 | Meyer et al. | |
| 2011/0086461 A1* | 4/2011 | Bolis | 438/65 |
| 2011/0157452 A1 | 6/2011 | Goh et al. | |
| 2011/0249111 A1 | 10/2011 | Weiss et al. | |
| 2012/0104625 A1 | 5/2012 | Park et al. | |

* cited by examiner

*Primary Examiner* — Asok K Sarkar
(74) *Attorney, Agent, or Firm* — Allen, Dyer, Doppelt, Milbrath & Gilchrist, P.A.

(57) ABSTRACT

A method of making image sensor devices may include forming a sensor layer including image sensor ICs in an encapsulation material, bonding a spacer layer to the sensor layer, the spacer layer having openings therein and aligned with the image sensor ICs, and bonding a lens layer to the spacer layer, the lens layer including lens in an encapsulation material and aligned with the openings and the image sensor ICs. The method may also include dicing the bonded-together sensor, spacer and lens layers to provide the image sensor devices. Helpfully, the method may use WLP to enhance production.

24 Claims, 5 Drawing Sheets

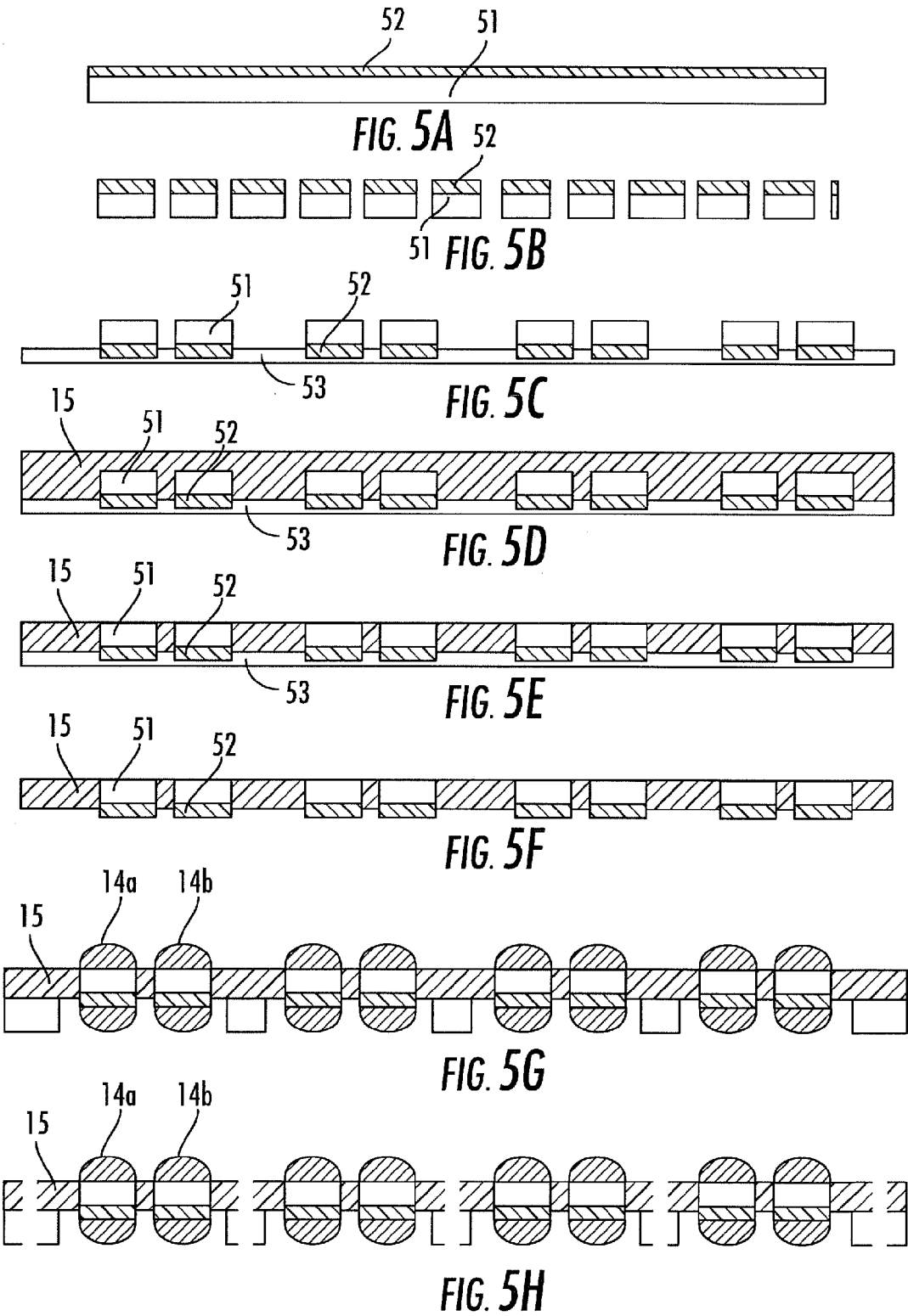

METHOD FOR MAKING IMAGE SENSORS USING WAFER-LEVEL PROCESSING AND ASSOCIATED DEVICES

FIELD OF THE DISCLOSURE

The present disclosure relates to the field of electronic device manufacturing, and, more particularly, to image sensors and related methods.

BACKGROUND

Typically, electronic devices include one or more optical sensor modules for providing enhanced media functionality. For example, the typical electronic device may utilize the optical sensor modules for photo capturing and video teleconferencing. In the typical electronic device with multiple optical sensor modules, the primary optical sensor module has a high pixel density and an adjustable focus lens system, while the secondary optical sensor module is front-facing and has a lower pixel density. Also, the secondary optical sensor module may have a fixed focus lens system.

For example, U.S. Patent Application No. 2009/0057544 to Brodie et al, assigned to the present application's assignee, discloses a optical sensor module for a mobile device. The optical sensor module comprises a lens, a housing carrying the lens, and a lens cap over the lens and housing. The optical sensor module includes a barrel mechanism for adjusting the lens. During manufacture of an electronic device including one or more optical sensor modules, there is a desire to manufacture the electronic device as quickly as possible, particularly in mass production runs.

The typical optical sensor module is manufactured in a multi-step process. The first steps include semiconductor processing to provide the image sensor integrated circuit (IC). The next steps include some form of testing for the image sensor IC and packaging. The image sensor IC may be assembled into the optical sensor module, along with a lens and movable barrel if needed. This assembly of the optical sensor module may be performed manually or via machine. For example, in electronic devices that use surface mounted components, a pick-and-place (PNP) machine may assemble the components onto a printed circuit board (PCB). A drawback to such singular packaging is that it is inefficient and also may require that each device be tested individually, adding to the manufacturing time.

SUMMARY

In view of the foregoing background, it is therefore an object of the present disclosure to provide a method of making image sensor devices that is efficient and robust.

This and other objects, features, and advantages in accordance with the present disclosure are provided by a method of making a plurality of image sensor devices that may comprise forming a sensor layer comprising a plurality of image sensor integrated circuits (ICs) in an encapsulation material, bonding a spacer layer to the sensor layer. The spacer layer may have a plurality of openings therein and aligned with the plurality of image sensor ICs. The method may further include bonding a lens layer to the spacer layer, with the lens layer comprising a plurality of lenses in an encapsulation material and aligned with the plurality of openings and the plurality of image sensor ICs. The method may include dicing the bonded-together sensor, spacer and lens layers to provide the plurality of image sensor devices. For example, the bonded together layers may comprise wafer sized layers.

Advantageously, this wafer-level processing (WLP) method may extend the wafer fabrication process to include device interconnection and device protection processes.

More specifically, the method may further comprise forming at least one electrically conductive via in the sensor layer, forming first and second electrically conductive layers respectively on first and second sides of the sensor layer, and forming a plurality of electrically conductive contacts on the first side of the sensor layer. The method may further comprise forming an adhesive layer on the second side of the sensor layer. For example, the plurality of electrically conductive contacts may comprise a ball grid array of electrically conductive contacts. The method may further comprise forming a passivation layer on each of the first and second sides of the sensor layer.

Additionally, the forming of the sensor layer may comprise positioning the plurality of image sensor ICs on a first carrier layer, forming the encapsulation material on the plurality of image sensor ICs and the first carrier layer, and removing the first carrier layer. In some embodiments, the method may further comprise forming the spacer layer by at least positioning a plurality of sacrificial bodies on a second carrier layer, forming encapsulation material on the plurality of sacrificial bodies and the second carrier layer, and removing the second carrier layer. Also, the forming of the spacer layer may comprise thinning the spacer layer so that a thickness of the spacer layer is equal with that of each sacrificial body, forming an adhesive layer on the encapsulation material, forming recesses in the adhesive layer over each of the sacrificial bodies, and etching the plurality of sacrificial bodies to define the plurality of openings.

Moreover, the method may further comprise forming the lens layer by at least forming a coating layer on a glass layer, dicing the glass layer to define the plurality of lenses, and positioning the plurality of lenses on a third carrier layer. The forming of the lens layer may further comprise forming the encapsulation material on the plurality of lenses and the third carrier layer, thinning the lens layer so that a thickness of the encapsulation material is equal to that of the plurality of lenses, and removing the third carrier layer.

Another aspect is directed to an image sensor device that may comprise a sensor layer having first and second sides and comprising an encapsulation material layer, and a plurality of image sensor ICs therein, and a spacer layer over the first side of the sensor layer and comprising a plurality of openings therein aligned with the plurality of image sensor ICs. The image sensor device may also include a lens layer over the spacer layer and comprising an encapsulation material layer, and a plurality of lenses therein and aligned with the plurality of openings and the plurality of image sensor ICs.

BRIEF DESCRIPTION OF THE DRAWINGS

FIGS. 5A-5H are cross-section views of steps for forming the lens layer of the image sensor devices of FIG. 1.

DETAILED DESCRIPTION OF THE PREFERRED EMBODIMENTS

The present embodiments will now be described more fully hereinafter with reference to the accompanying drawings, in which preferred embodiments are shown. This present disclosure may, however, be embodied in many different forms and should not be construed as limited to the embodiments set forth herein. Rather, these embodiments are provided so that this disclosure will be thorough and complete, and will fully convey the scope of the present embodiments to those skilled in the art. Like numbers refer to like elements throughout.

Figure 1:
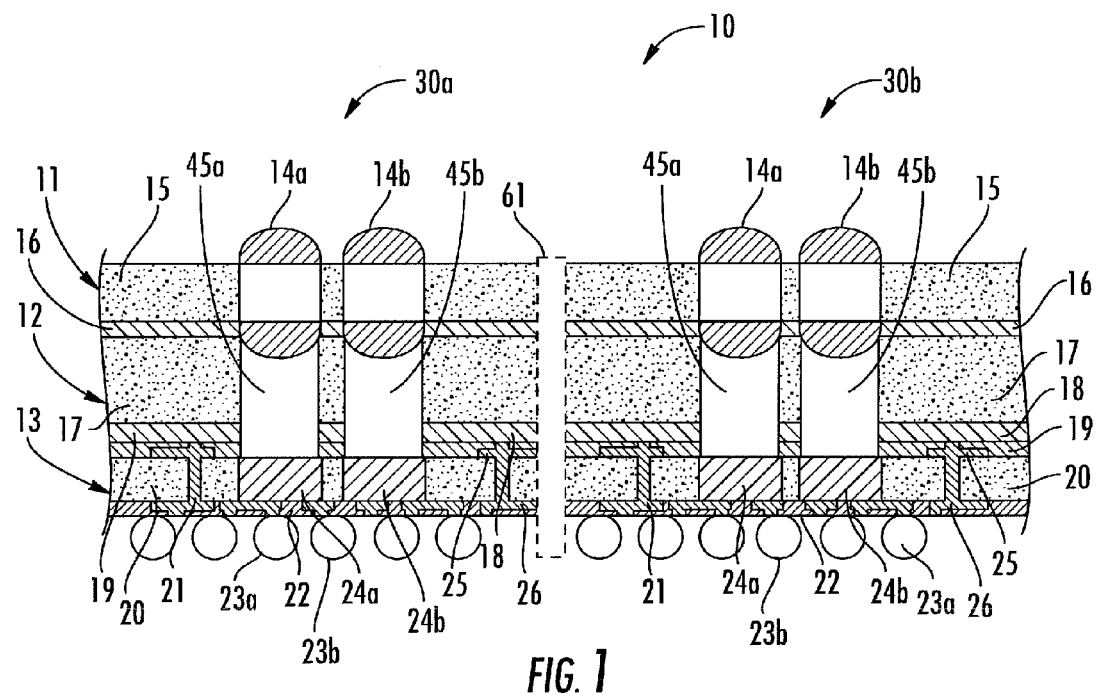
FIG. 1 is a cross-section view of a plurality of image sensor devices, according to the present disclosure.
Figure 2:
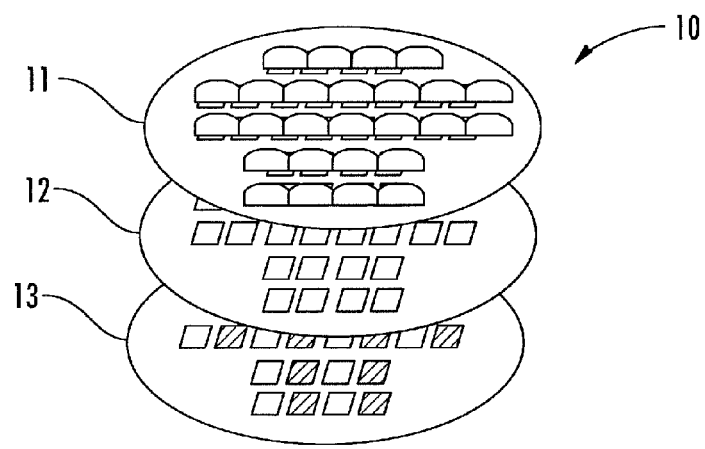
FIG. 2 is an exploded view of the lens layer, the spacer layer, and sensor layer from the plurality of image sensor devices of FIG. 1.
Figure 3A:
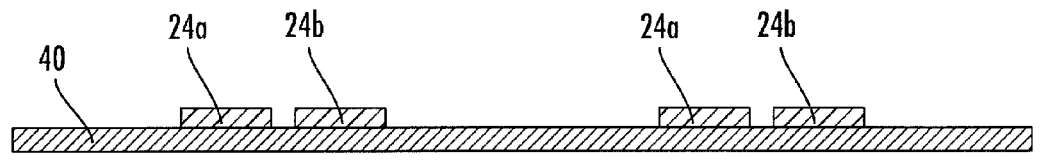
FIGS. 3A-3F are cross-section views of steps for forming the sensor layer of the image sensor devices of FIG. 1.
Figure 3B:
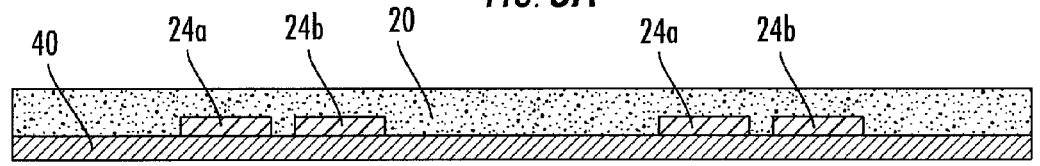
Figure 3C:
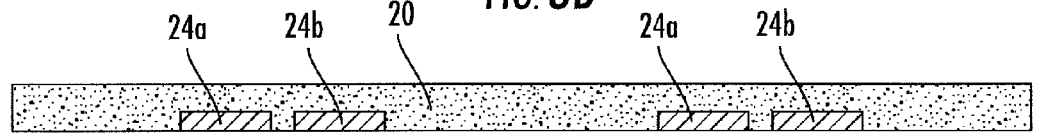
Figure 3D:
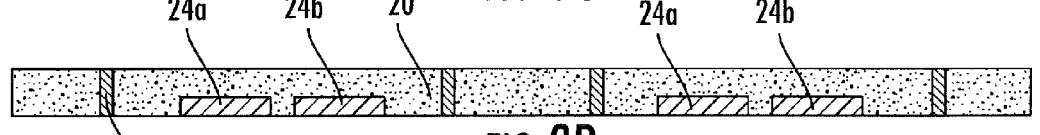
Figure 3E:
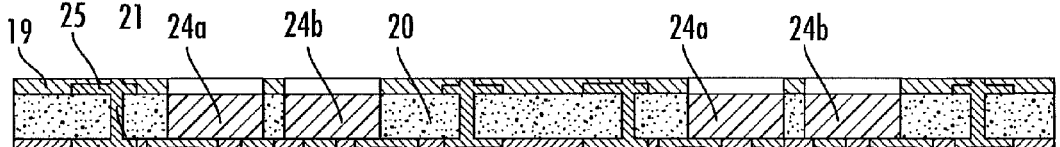
Figure 3F:
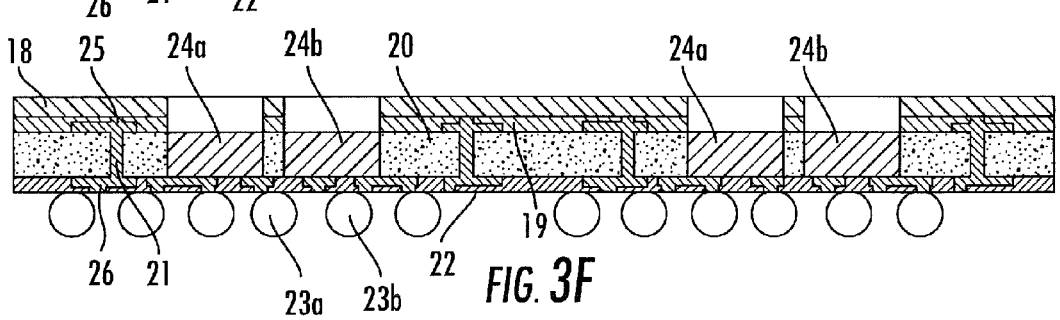
Figure 4A:
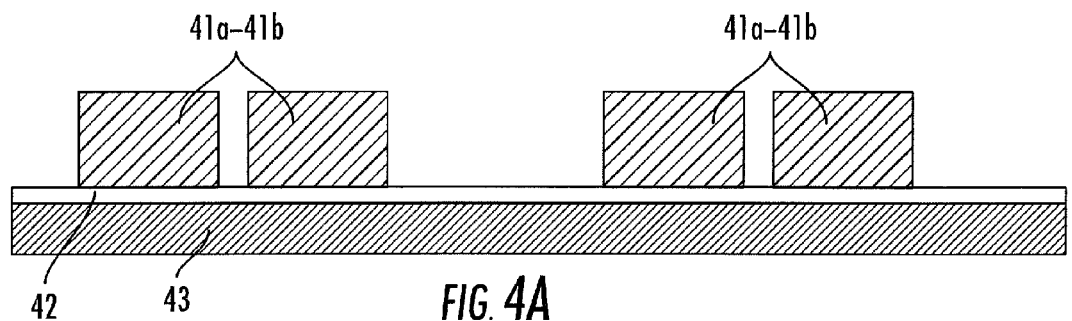
FIGS. 4A-4G are cross-section views of steps for forming the spacer layer of the image sensor devices of FIG. 1.
Figure 4B:
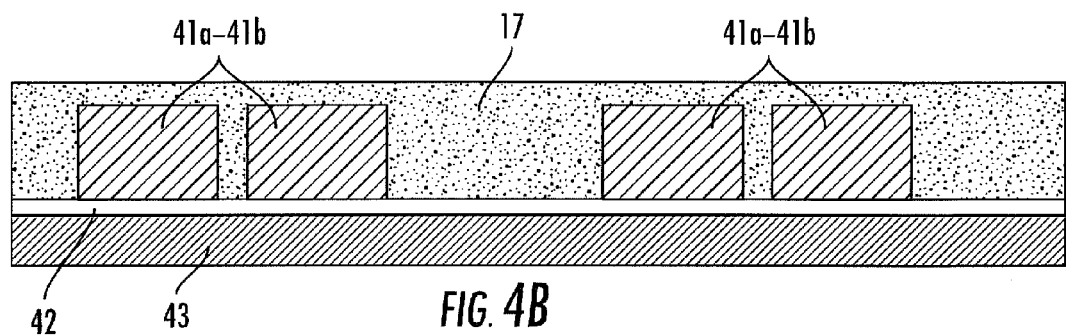
Figure 4C:
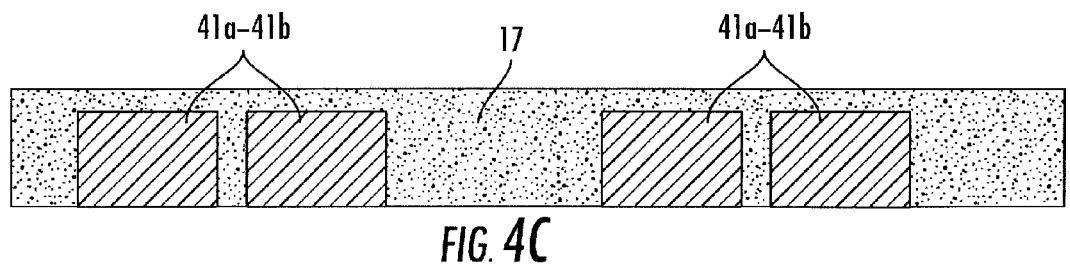
Figure 4D:
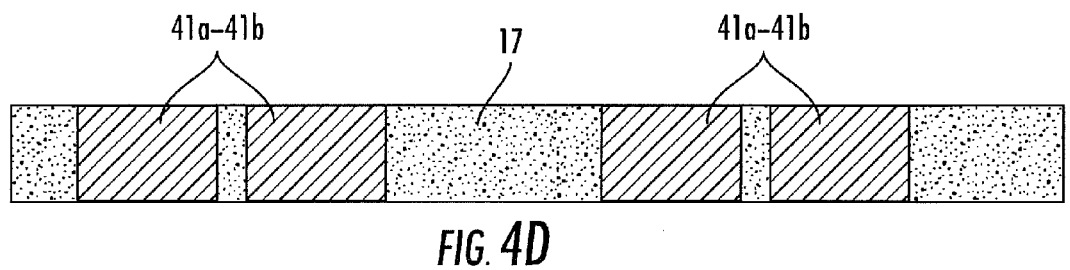
Figure 4E:
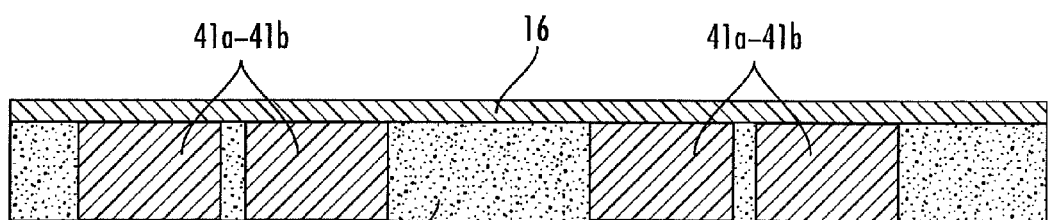
Figure 4F:
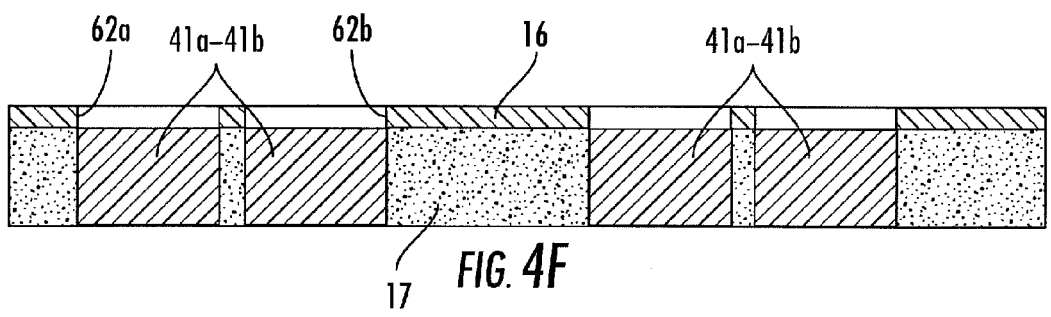
Figure 4G:
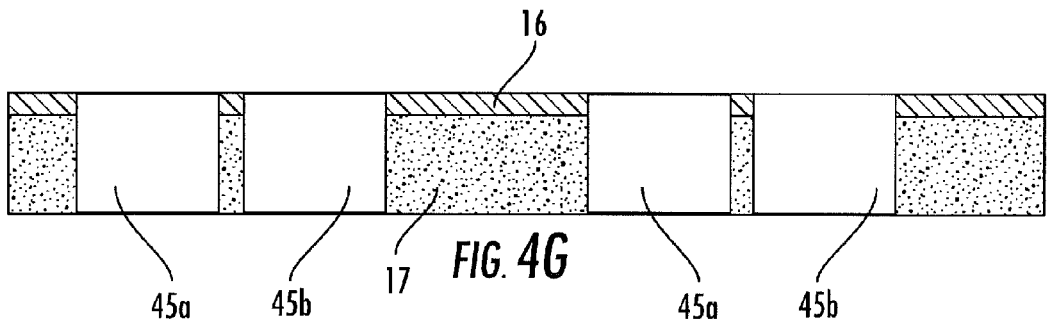

Referring to FIGS. 1-2, an image sensor device 30a, 30b according to the present disclosure is now described. The image sensor device 30a, 30b illustratively includes a sensor layer 13 having first and second sides and comprising an encapsulation material layer 20, and a plurality of image sensor ICs 24a-24b therein, and a spacer layer 12 over the first side of the sensor layer and comprising a plurality of openings 45a-45b therein aligned with the plurality of image sensor ICs. In FIG. 1, only two image sensor devices 30a, 30b are illustratively shown. The image sensor device 30a, 30b illustratively includes a lens layer 11 over the spacer layer 12 and comprising an encapsulation material layer 15, and a plurality of lenses 14a-14b therein and aligned with the plurality of openings 45a-45b and the plurality of image sensor ICs 24a-24b.

The image sensor device 30a, 30b illustratively includes a first adhesive layer 16 between the lens layer 11 and the spacer layer 12, and a second adhesive layer 18 between the spacer layer and the sensor layer 13. The image sensor device 30a, 30b illustratively includes a plurality of electrically conductive contacts 23a-23b on the first side (i.e. backside) of the sensor layer 13. For example, the plurality of electrically conductive contacts 23a-23b illustratively comprises a ball grid array of electrically conductive contacts.

The sensor layer 13 comprises a plurality of electrically conductive vias 21 extending between first and second sides thereof. The image sensor device 30a, 30b illustratively includes first and second electrically conductive layers 26, 25 respectively on the first and second sides of the sensor layer 13, each being coupled to the electrically conductive vias 21.

Referring now additionally to FIGS. 3A-3F, a method of making the plurality of image sensor devices 30a, 30b according to the present disclosure is now described. The method comprises forming the sensor layer 13 comprising the plurality of image sensor ICs 24a-24b in an encapsulation material 20. In particular, the forming of the sensor layer 13 illustratively includes positioning the plurality of image sensor ICs 24a-24b on a first carrier layer 40, forming the encapsulation material 20 on the plurality of image sensor ICs and the first carrier layer, and removing the first carrier layer.

Additionally, the method illustratively comprises forming the plurality of electrically conductive vias 21 in the sensor layer 13, forming first and second electrically conductive layers 26, 25 respectively on first and second sides of the sensor layer, and forming a plurality of electrically conductive contacts 23a-23b on the first side of the sensor layer. The method further comprises forming an adhesive layer 18 on the second side of the sensor layer 13. For example, in the illustrated embodiment, the plurality of electrically conductive contacts 23a-23b comprises a ball grid array of electrically conductive contacts. The method further comprises forming a passivation layer 19, 22 on each of the first and second sides of the sensor layer 13.

Referring now additionally to FIGS. 4A-4G, the method also includes bonding the spacer layer 12 to the sensor layer 13. The spacer layer 12 illustratively includes a plurality of openings 45a-45b therein and aligned with the plurality of image sensor ICs 24a-24b. The forming of the spacer layer 12 illustratively includes positioning a plurality of sacrificial bodies 41a-41b on a second carrier layer 43 (using an adhesive material 42 thereon), forming encapsulation material 17 on the plurality of sacrificial bodies and the second carrier layer, and removing the second carrier layer. Also, the forming of the spacer layer 12 comprises thinning the spacer layer so that a thickness of the spacer layer is equal with that of each sacrificial body 41a-41b, forming an adhesive layer 16 on the encapsulation material, forming recesses 62a-62b in the adhesive layer over each of the sacrificial bodies, and etching the plurality of sacrificial bodies to define the plurality of openings 45a-45b.

Referring now additionally to FIGS. 5A-5H the method also includes bonding the lens layer 11 to the spacer layer 12, the lens layer comprising the plurality of lenses 14a-14b in an encapsulation material 15 and aligned with the plurality of openings 45a-45b and the plurality of image sensor ICs 24a-24b.

Moreover, the forming of the lens layer 11 comprises forming a coating layer 52 on a glass layer 51, dicing the glass layer to define the plurality of lenses 14a-14b, and positioning the plurality of lenses on a third carrier layer 53. The forming of the lens layer 11 further comprises forming the encapsulation material 15 on the diced glass layer 51 and the third carrier layer 53, thinning the lens layer so that a thickness of the encapsulation material is equal to that of the plurality of lenses 14a-14b, and removing the third carrier layer.

The method illustratively includes dicing the bonded-together sensor 13, spacer 12 and lens 11 layers to provide the plurality of image sensor devices 30a, 30b. As shown in FIG. 1, a schematic box 61 represents a potential dicing cut line, singularizing the image sensor devices 30a, 30b. For example, as perhaps best seen in FIG. 2, the bonded together layers 11-13 may comprise wafer sized layers 10. Advantageously, the method may provide a large number of image sensor devices on a wafer level.

Advantageously, the herein disclosed method may manufacture the image sensor devices 30a, 30b using WLP. This may reduce the cost and time associated with large production runs. Moreover, it allows for a single alignment and bonding process, more like batch processing, instead of a single unit process, which is more costly.

Another aspect is directed to an image sensor device 30a, 30b that may comprise a sensor layer 13 having first and second sides and comprising an encapsulation material layer 20, and a plurality of image sensor ICs 24a-24b therein, and a spacer layer 12 over the first side of the sensor layer and comprising a plurality of openings 45a-45b therein aligned with the plurality of image sensor ICs. The image sensor device 30a, 30b may also include a lens layer 11 over the spacer layer 12 and comprising an encapsulation material layer 15, and a plurality of lenses 14a-14b therein and aligned with the plurality of openings 45a-45b and the plurality of image sensor ICs 24a-24b.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:
1. A method of making a plurality of image sensor devices comprising:
    forming a sensor layer comprising a plurality of image sensor integrated circuits (ICs) in an encapsulation material;

bonding a spacer layer to the sensor layer, the spacer layer having a plurality of openings therein and aligned with the plurality of image sensor ICs;

bonding a lens layer to the spacer layer, the lens layer comprising a plurality of lenses in an encapsulation material and aligned with the plurality of openings and the plurality of image sensor ICs; and dicing the bonded-together sensor, spacer and lens layers to provide the plurality of image sensor devices.

2. The method of claim 1 further comprising:
forming at least one electrically conductive via in the sensor layer;
forming first and second electrically conductive layers respectively on first and second sides of the sensor layer; and
forming a plurality of electrically conductive contacts on the first side of the sensor layer.

3. The method of claim 2 further comprising forming an adhesive layer on the second side of the sensor layer.

4. The method of claim 2 wherein forming the plurality of electrically conductive contacts comprises forming a ball grid array of electrically conductive contacts.

5. The method of claim 2 further comprising forming a passivation layer on each of the first and second sides of the sensor layer.

6. The method of claim 1 wherein forming the sensor layer comprises:
positioning the plurality of image sensor ICs on a first carrier layer;
forming the encapsulation material on the plurality of image sensor ICs and the first carrier layer; and
removing the first carrier layer.

7. The method of claim 1 further comprising forming the spacer layer by at least:
positioning a plurality of sacrificial bodies on a second carrier layer;
forming encapsulation material on the plurality of sacrificial bodies and the second carrier layer; and
removing the second carrier layer.

8. The method of claim 7 wherein forming the spacer layer comprises:
thinning the spacer layer so that a thickness of the spacer layer is equal with that of each sacrificial body;
forming an adhesive layer on the encapsulation material;
forming recesses in the adhesive layer over each of the sacrificial bodies; and
etching the plurality of sacrificial bodies to define the plurality of openings.

9. The method of claim 1 further comprising forming the lens layer by at least:
forming a coating layer on a glass layer;
dicing the glass layer to define the plurality of lenses; and
positioning the plurality of lenses on a third carrier layer.

10. The method of claim 9 wherein forming the lens layer comprises:
forming the encapsulation material on the plurality of lenses and the third carrier layer;
thinning the lens layer so that a thickness of the encapsulation material is equal to that of the plurality of lenses; and
removing the third carrier layer.

11. The method of claim 1 wherein the bonded together layers comprise wafer sized layers.

12. A method of making a plurality of image sensor devices comprising:
positioning a plurality of image sensor integrated circuits (ICs) on a first carrier layer;
forming encapsulation material on the plurality of image sensor ICs and the first carrier layer;
removing the first carrier layer to provide a sensor layer comprising the plurality of image sensor ICs in the encapsulation material;
forming at least one electrically conductive via in the sensor layer;
forming first and second electrically conductive layers respectively on first and second sides of the sensor layer;
forming a plurality of electrically conductive contacts on the first side of the sensor layer;
bonding a spacer layer to the sensor layer, the spacer layer having a plurality of openings therein and aligned with the plurality of image sensor ICs;
bonding a lens layer to the spacer layer, the lens layer comprising a plurality of lenses in an encapsulation material and aligned with the plurality of openings and the plurality of image sensor ICs; and
dicing the bonded-together sensor, spacer and lens layers to provide the plurality of image sensor devices.

13. The method of claim 12 further comprising forming an adhesive layer on the second side of the sensor layer.

14. The method of claim 12 wherein forming the plurality of electrically conductive contacts comprises forming a ball grid array of electrically conductive contacts.

15. The method of claim 12 further comprising forming a passivation layer on each of the first and second sides of the sensor layer.

16. The method of claim 12 further comprising forming the spacer layer by at least:
positioning a plurality of sacrificial bodies on a second carrier layer;
forming encapsulation material on the plurality of sacrificial bodies and the second carrier layer; and
removing the second carrier layer.

17. The method of claim 16 wherein forming the spacer layer comprises:
thinning the spacer layer so that a thickness of the spacer layer is equal with that of each sacrificial body;
forming an adhesive layer on the encapsulation material;
forming recesses in the adhesive layer over each of the sacrificial bodies; and
etching the plurality of sacrificial bodies to define the plurality of openings.

18. The method of claim 12 further comprising forming the lens layer by at least:
forming a coating layer on a glass layer;
dicing the glass layer to define the plurality of lenses; and
positioning the plurality of lenses on a third carrier layer.

19. An image sensor device comprising:
a sensor layer having first and second sides and comprising an encapsulation material layer, and a plurality of image sensor integrated circuits (ICs) being surrounded by said encapsulation material layer;
a spacer layer over the first side of said sensor layer and having a plurality of openings therein aligned with said plurality of image sensor ICs; and
a lens layer over the spacer layer and comprising an encapsulation material layer, and a plurality of lenses being carried by said encapsulation material layer of said lens layer and aligned with the plurality of openings and said plurality of image sensor ICs.

20. The image sensor device of claim 19 further comprising a first adhesive layer between said lens layer and said spacer layer, and a second adhesive layer between said spacer layer and said sensor layer.

21. The image sensor device of claim 19 further comprising a plurality of electrically conductive contacts on the first side of said sensor layer.

22. The image sensor device of claim 21 wherein said plurality of electrically conductive contacts comprises a ball grid array of electrically conductive contacts.

23. The image sensor device of claim 19 wherein said sensor layer comprises at least one electrically conductive via.

24. The image sensor device of claim 19 further comprising first and second electrically conductive layers respectively on the first and second sides of said sensor layer.

* * * * *